United States Patent
Grover

(10) Patent No.: US 8,344,448 B2
(45) Date of Patent: Jan. 1, 2013

(54) SEMICONDUCTOR DEVICE HAVING AN EDGE TERMINATION STRUCTURE AND METHOD OF MANUFACTURE THEREOF

(75) Inventor: Raymond J. Grover, Manchester (GB)

(73) Assignee: NXP B.V., Eindhoven (NL)

( * ) Notice: Subject to any disclaimer, the term of this patent is extended or adjusted under 35 U.S.C. 154(b) by 1891 days.

(21) Appl. No.: 10/561,531

(22) PCT Filed: May 21, 2004

(86) PCT No.: PCT/IB2004/001779
§ 371 (c)(1),
(2), (4) Date: Jul. 31, 2006

(87) PCT Pub. No.: WO2004/107448
PCT Pub. Date: Dec. 9, 2004

(65) Prior Publication Data
US 2011/0291185 A1    Dec. 1, 2011

(30) Foreign Application Priority Data
May 31, 2003 (GB) .................................. 0312512.7

(51) Int. Cl.
*H01L 29/66* (2006.01)

(52) U.S. Cl. ........ 257/328; 257/334; 257/776; 257/331; 257/367; 257/E29.262; 438/270; 438/268; 438/133; 360/20

(58) Field of Classification Search ............... 257/334, 257/328, 331, 496, 367, E29.262, E21.09; 438/133, 270, 268
See application file for complete search history.

(56) References Cited

U.S. PATENT DOCUMENTS

| | | | |
|---|---|---|---|
| 4,468,686 A | | 8/1984 | Rosenthal |
| 4,646,115 A | | 2/1987 | Shannon et al. |
| 4,992,390 A | * | 2/1991 | Chang ........................... 438/270 |
| 5,474,946 A | | 12/1995 | Ajit et al. |
| 5,557,127 A | | 9/1996 | Ajit et al. |
| 5,612,567 A | | 3/1997 | Baliga |
| 5,877,528 A | * | 3/1999 | So ................................ 257/341 |
| 6,204,097 B1 | | 3/2001 | Shen |
| 2002/0168821 A1 | * | 11/2002 | Williams et al. ............... 438/268 |
| 2003/0001215 A1 | | 1/2003 | Wahl et al. |

FOREIGN PATENT DOCUMENTS

| | | |
|---|---|---|
| EP | 1 041 640 | 10/2000 |
| EP | 1 191 603 | 3/2002 |

OTHER PUBLICATIONS

B. J. Baliga: "Power Semiconductor Devices"; 1996; pp. 81-113.

* cited by examiner

Primary Examiner — Eugene Lee
Assistant Examiner — Elias M Ullah

(57) ABSTRACT

A semiconductor device having a semiconductor body comprising an active area and a termination structure surrounding the active area, and a method for the manufacture thereof. The invention particularly concerns a termination structure for such devices having trenched electrodes in the active area. The termination structure comprises a plurality of lateral trench-gate transistor devices connected in series and extending from the active area towards a peripheral edge of the semiconductor body. The lateral devices are arranged such that a voltage difference between the active area and the peripheral edge is distributed across the lateral devices. The termination structure is compact and features of the structure are susceptible for formation in the same process steps as features of the active area.

12 Claims, 6 Drawing Sheets

SEMICONDUCTOR DEVICE HAVING AN EDGE TERMINATION STRUCTURE AND METHOD OF MANUFACTURE THEREOF

The present invention relates to field termination structures for semiconductor devices, for example insulated-gate field effect power transistors (commonly termed "MOSFETs"), insulated-gate bipolar transistors (commonly termed "IGBTs"), or Schottky rectifiers, and methods for the manufacture thereof.

Semiconductor devices generally include a semiconductor body comprising an active area which has an array of active structures therein. The invention is directed at devices having trenched electrode structures in the active area. To avoid premature breakdown of the devices at the perimeter of the active area, it is often necessary to include a field termination structure surrounding the active area to avoid the occurrence of excessively high electric fields. Several field termination structures are known in the art, such as floating field plates and floating field rings. These structures are discussed for example in "Power Semiconductor Devices", 1996, by B. J. Baliga, at pages 81 to 113, the contents of which are hereby incorporated herein as reference material.

The present invention seeks to provide a termination structure for a device having trenched electrode structures in the active area, whilst minimising the extra processing required to form the termination structure.

The present invention provides a semiconductor device having a semiconductor body comprising an active area and a termination structure surrounding the active area, the termination structure comprising a plurality of lateral trench-gate transistor devices connected in series and extending from the active area towards a peripheral edge of the semiconductor body, each lateral device comprising a trench having a gate electrode therein separated from the semiconductor body by a layer of gate insulating material, the trenches, gate electrodes and layers of gate insulating material of the lateral devices being formed in the same respective process steps as trenches, insulated electrodes therein and layers of material insulating the insulated electrodes of devices in the active area, the gate electrodes of the lateral devices extending through a region of a first conductivity type, and part way through an underlying region of a second, opposite conductivity type, with each lateral device including an electrically conductive connection between its gate electrode and the first conductivity type region at the side of the lateral device closer to the active area, such that a voltage difference between the active area and the peripheral edge is distributed across the lateral devices.

A semiconductor device according to the invention thereby includes a compact termination structure having features formed in the same process steps as trenched electrode features in the active area of the device, avoiding the need for extra process steps to form these features of the termination structure.

With the lateral devices arranged in the manner defined above, each lateral device will only turn on fully when the voltage thereacross exceeds its threshold voltage. Thus the termination structure may support a voltage across it of a magnitude up to the sum of the respective threshold voltages of the lateral devices. In use, at voltages below this limit, each lateral device conducts a negligible sub-threshold current and drops a proportion of the total applied voltage across it which is less than its threshold voltage. The applied voltage is therefore substantially evenly distributed or divided, avoiding high electric field peaks.

Preferably, the active area comprises devices having a region of the first conductivity type which is formed in the same process step as the first conductivity type region of the lateral devices. In this way, another feature of the termination structure may be made in the same processing step as a feature of the active area.

In a preferred embodiment, the insulated electrodes of the active area devices are gate electrodes of trench-gate transistor devices, and the first conductivity type region of the active area devices forms a channel-accommodating region thereof.

In a further embodiment, the insulated electrodes of the active area devices are trenched electrodes of Schottky rectifiers.

The layer of insulating material may be thicker over the bottom of the gate trenches of the lateral devices than over at least a portion of the sidewalls of said trenches. This serves to increase the threshold voltage of the lateral transistor devices, which increases the voltage drop across the devices when turned on, as will be described in more detail below.

Furthermore, the doping level of a respective portion of the region of second conductivity type adjacent the bottom of each of the gate trenches of the lateral devices may be higher than that of the remainder of the second conductivity type region. This also increases the threshold voltage of the lateral transistor devices, and hence increases the voltage drop across the devices.

Increasing the voltage that may be supported across each lateral device as described above in turn increases the breakdown voltage of the termination structure, and may allow the number of lateral devices required to achieve a given breakdown voltage to be reduced, thereby further reducing the area required for the termination structure.

Typically, the semiconductor body is rectangular in the plane of the body. To minimise the area occupied by the termination structure, the connections may be provided towards one or more corners of the body. The spacing between adjacent lateral transistors may then be increased locally to accommodate the connections only in the one or more corners.

The invention further provides a method of forming a semiconductor device having a semiconductor body comprising an active area and a termination structure surrounding the active area, the termination structure comprising a plurality of lateral trench-gate transistor devices connected in series and extending from the active area towards a peripheral edge of the semiconductor body, each lateral device comprising a trench having a gate electrode therein separated from the semiconductor body by a layer of gate insulating material, the gate electrodes of the lateral devices extending through a region of a first conductivity type, and part way through an underlying region of a second, opposite conductivity type, with each lateral device including an electrically conductive connection between its gate electrode and the first conductivity type region at the side of the lateral device closer to the active area, such that a voltage difference between the active area and the edge is distributed across the lateral devices, the method comprising forming the trenches, gate electrodes and layers of gate insulating material of the lateral devices in the same respective process steps as trenches, insulated electrodes therein and layers of material insulating the insulated electrodes of devices in the active area.

In a preferred embodiment, the method comprises forming a region of the first conductivity type in devices of the active area in the same process step as the first conductivity type region of the lateral devices.

Furthermore, other features of the termination structure may be made in the same process steps as features of the active area as described below, avoiding the need for additional dedicated processing.

Embodiments of the invention will now be described by way of example and with reference to the accompanying schematic drawings, wherein.

Figure 1:
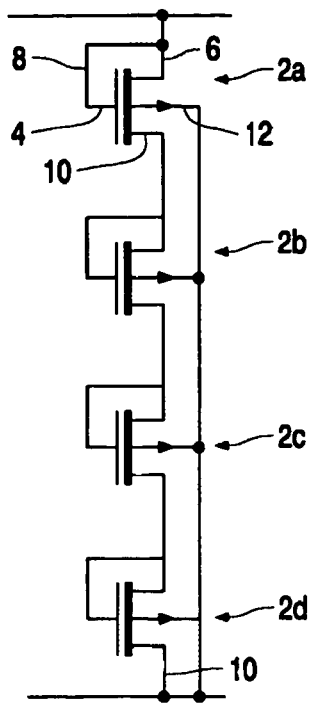
FIG. 1 shows a circuit diagram of transistor devices connected together in a termination structure in accordance with the invention.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

FIG. 1 shows a string of p-channel MOSFETs 2a to 2d connected together in series for use in a termination structure of a semiconductor device according to an embodiment of the invention. Four MOSFETs are shown by way of example, but it will be appreciated that a different number of devices may be employed, depending on the voltage that is to be supported across the MOSFETs. In later cross-sectional drawings only three lateral devices are shown in the termination structure for clarity.

The gate electrode 4 of each MOSFET is connected to its drain electrode 6 by a connector 8. The source electrode 10 of the first MOSFET 2a in the string is connected to the drain electrode of the next MOSFET 2b in the string, and so on along the string. The MOSFETs have a common body region and so their body terminals 12 are shown connected together.

In a termination structure, one end of the string, that is the drain electrode of the first MOSFET 2a is connected to a first main electrode of the semiconductor device, the other end of the string, that is the source electrode 10 of the last MOSFET 2d is connected to the potential of a second main electrode of the semiconductor device.

With the MOSFETs of FIG. 1 connected together in the manner shown, the voltage across each MOSFET, at the point where it just starts to conduct current is equal to the threshold voltage of the respective MOSFET. Thus, each device may support a voltage thereacross up to a maximum of its threshold voltage. The potential applied across the string of MOSFETs is divided across the MOSFETs, approximately uniformly distributing the associated electric field thereby avoiding any field concentration leading to premature breakdown.

Figure 2:
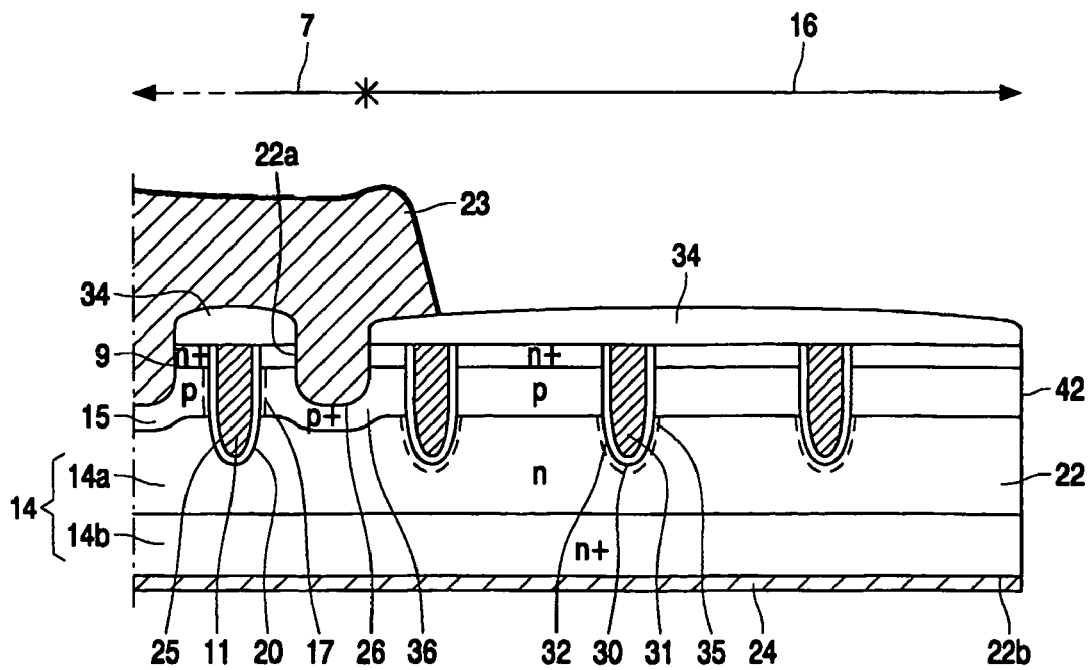
FIG. 2 shows a cross-sectional view of the active area and termination structure of a semiconductor device in accordance with an embodiment of the invention.

A cross-sectional view through a semiconductor device embodying the invention is shown in FIG. 2. The cross-section is perpendicular to the plane of the semiconductor body (typically formed of monocrystalline silicon). The active area 7 of the device is shown on the left of the Figure, with a termination structure 16 on the right. By way of example, the active area illustrated comprises trench-gate transistor cells. Source and drain regions 9 and 14, respectively, of a first conductivity type (n-type in this example) are separated by a channel-accommodating region 15 of the opposite second conductivity type (i.e. p-type in this example) in a semiconductor body 22. The gate electrode 11, typically formed of n-type polycrystalline silicon, is present in a trench 20 which extends through the regions 9 and 15 into an underlying portion of the drain region 14. The gate electrode is separated from the semiconductor body by a layer of gate insulating material 25. The application of a voltage signal to the gate electrode 11 in the on-state of the device serves in known manner for inducing a conduction channel 17 in the region 15 and for controlling current flow in this conduction channel 17 between the source and drain regions 9 and 14.

The source region 9 is contacted by a first main electrode of the semiconductor device, embodied in this example by source electrode 23. This contact is made at a top major surface 22a of the device body. The illustrated example includes a "moated" source to device body contact in which a groove 26 is etched through the source region 9 to enable direct contact between the source electrode 23 and channel-accommodating region 15. Such a structure may enable the mask count of the device fabrication process to be reduced as a mask is not required to pattern implantation of the source region. An example of a method for manufacturing a trench-gate device having the configuration shown in the active area 7 of FIG. 2 is disclosed in EP-A-0889511, the contents of which are hereby incorporated herein as reference material.

By way of example, FIG. 2 shows a vertical device structure in which the region 14 comprise a drain-drift region 14a formed by an epitaxial layer of high resistivity (n−, low doping) on a substrate region 14b of high conductivity (n+). This substrate region 14b may be of the same conductivity type (n-type in this example) as the region 14a to provide a vertical MOSFET, or it may be of opposite conductivity type (p-type in this example) to provide a vertical IGBT. The substrate region 14b is contacted at the bottom major surface 22b of the device body by a second main electrode 24 of the semiconductor device, called the drain electrode in the case of a MOSFET and called the anode electrode in the case of an IGBT.

The termination structure shown in FIG. 2 comprises lateral trench-gate transistor cells connected in series. Each lateral device comprises a trench 30 having a gate electrode 31 therein separated from the semiconductor body 22 by a layer of gate insulating material 32. An insulating cap 34 (formed of TEOS for example) extends over the top major surface 22a of the semiconductor body (restricted to the surface between the grooves 26 in the active area). In the on-state, a channel 35 is formed in the n-type region 14a, extending between the p-type regions 15 on either side of the trench 30. The p-type region on the side of the lateral device closer to the active area forms the drain of the lateral device, with the p-type region on the opposite side forming the source thereof. In the illustrated example, the channel 35 will be formed of p-type charge carriers.

The drain region of the lateral device adjacent to the active area is connected to the source electrode 23. The source region of the outermost lateral device may be shorted to the drain electrode 24 by the rough surface of peripheral edge 42 formed in cutting the semiconductor body 22 from a wafer. Alternatively, region 15 may be connected to the drain electrode 24 by an additional conductive connector extending over the surface of the semiconductor body.

It can be seen in FIG. 2 that the trenches 30, gate insulating material layer 32, and gate electrode 31 features of the termination structure correspond in configuration with the trenches 20, gate insulating material layer 25, and gate electrodes 11 of the active area. They may be efficiently fabricated in the same process steps as the corresponding active area features, avoiding the need for extra steps to form these elements of the termination structure.

The highly doped first conductivity type region 9 which forms the source regions of the devices in the active area 7 is shown in FIG. 2 as continuing through the termination structure 16. Alternatively, the termination structure area may be masked during implantation to form this region. In the embodiment of FIG. 2 this is a blanket implantation, so masking the termination structure area will require an additional mask.

Figure 3:
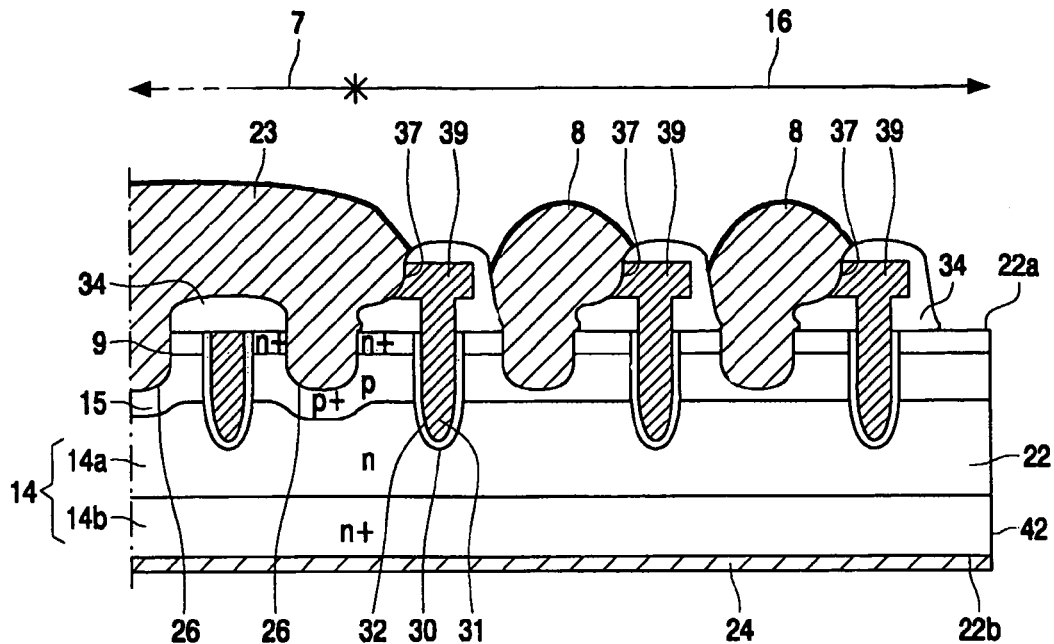
FIG. 3 shows a cross-sectional view of the active area and termination structure of a corner portion of the semiconductor device of FIG. 2.

As shown in FIG. 1, the gate electrodes of the lateral transistors in the termination structure are shorted to the respective drain regions by connectors 8. An implementation of this aspect is shown in FIG. 3. It shows a cross-sectional view of the active area and termination structure of a different portion of the semiconductor device of FIG. 2. This portion may be disposed towards a corner of the semiconductor body, as discussed below.

Grooves 26, present between the trenches of the active area as shown in FIG. 2, are also present in the portion of the termination structure shown in FIG. 3 to facilitate connection at the surface of the semiconductor body to the p-type region 15 underlying n-type region 9. Typically, insulating caps 34 are used as a mask in the active layer when etching the grooves. Conveniently, the caps 34 may be suitably patterned in the termination structure at the same time as those of the active area, and the grooves 26 may be etched in the termination structure in the same process step as those of the active area. Similarly, the caps 34 may be defined in the same process step in the active area and the termination structure in further embodiments discussed below.

A connector 8 of electrically conductive material is provided for each lateral transistor (except for the lateral transistor closest to the active area) which forms an electrical connection between the gate electrode 31 and the p-type region 15 at the side of the transistor closer to the active area 7. The connector contacts the p-type region at the wall of groove 26. To facilitate connection to the gate electrode in the embodiment shown in FIG. 3, the gate electrode material is extended out of the trench 30 and a surface 37 of this extension 39 is exposed for contact with the connector 8. In the case of the lateral transistor closest to the active area, its gate extension 39 is electrically connected to the p-type region 15 at the side of the transistor closer to the active area 7 by the source electrode 23.

The extension 39 may be formed for example by masking the gate electrode material after it has been deposited to fill the gate trenches and overlie the insulating cap 34, during etching back of this material level with the top of the trenches.

To avoid the need for an additional dedicated process step, the connectors 8 may be formed in the termination structure in the same process steps as the source electrode, in this embodiment and those discussed below.

Figure 4:
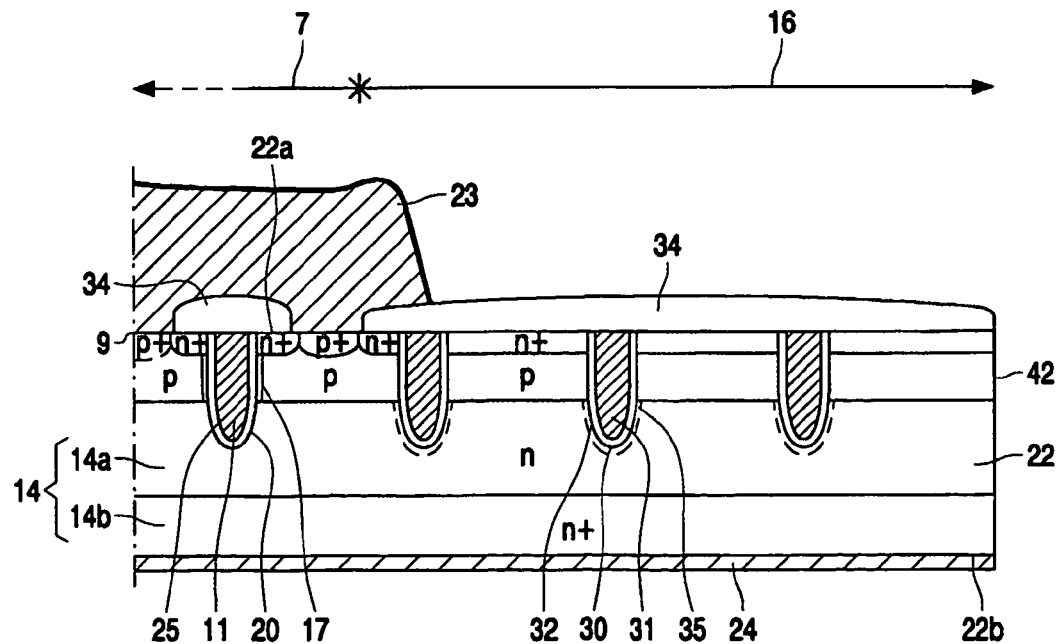
FIG. 4 shows a cross-sectional view of the active area and termination structure of a semiconductor device in accordance with a further embodiment of the invention.

FIG. 4 shows a cross-section similar to that of FIG. 2, but taken through an embodiment in which a separate masked implantation step is used to define the source regions 9 in the active area of the device and so the grooves 26 of FIG. 2 are not present.

Figure 5:
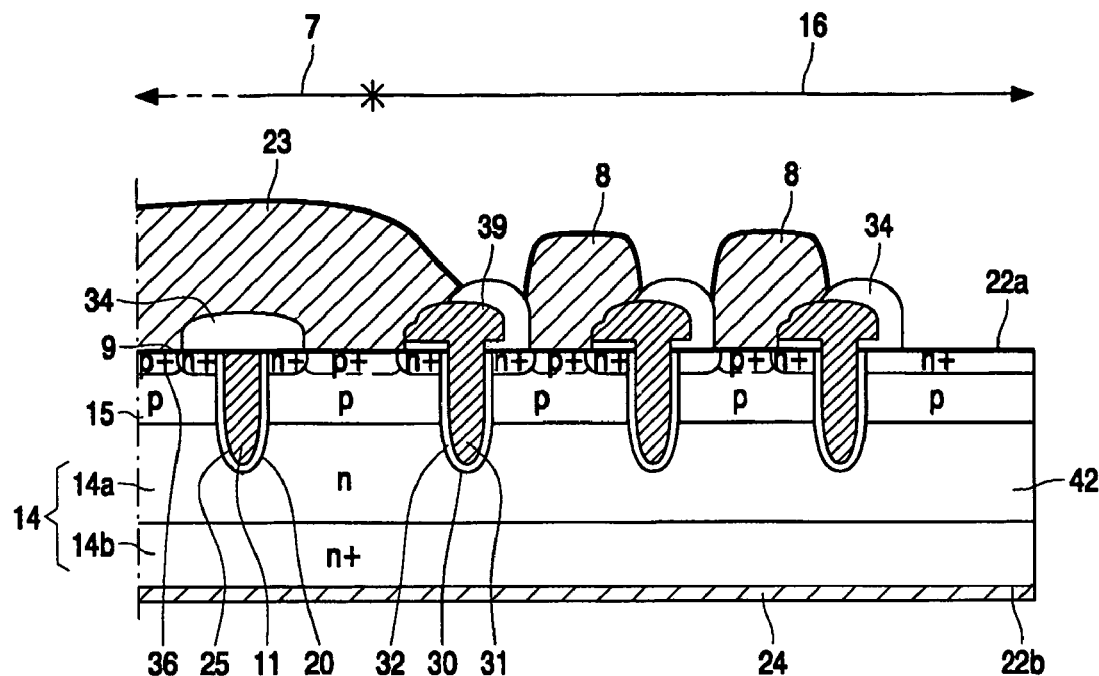
FIGS. 5 and 6 show cross-sectional views of the active area and termination structure of a corner portion in alternative configurations of the semiconductor device of FIG. 4.
Figure 6:
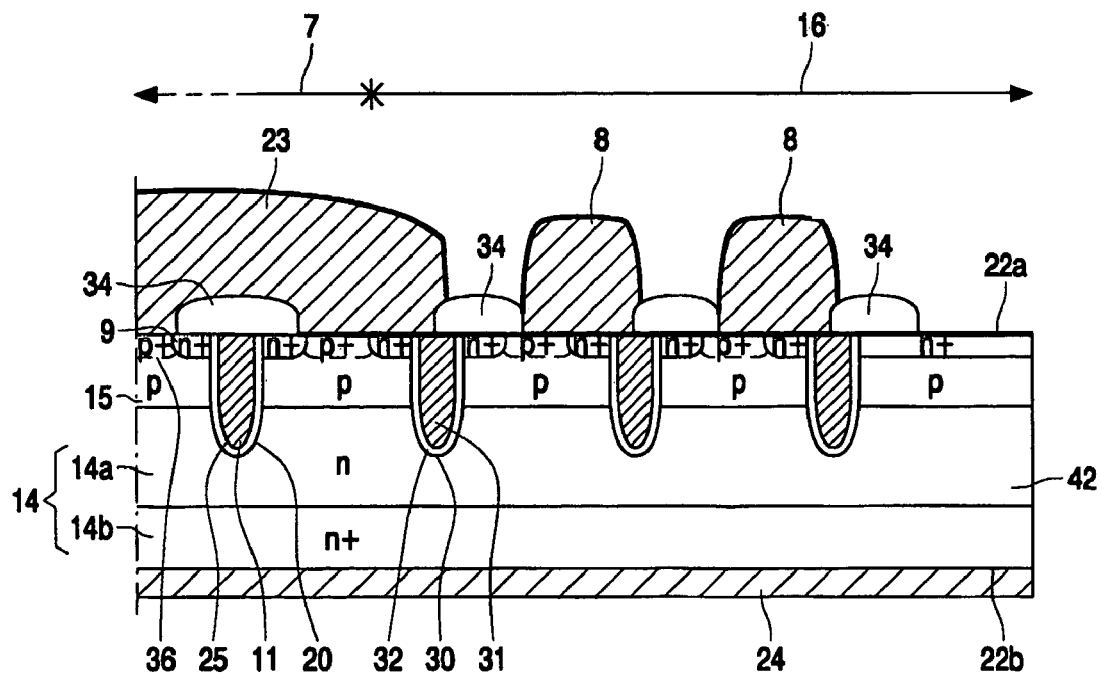

FIGS. 5 and 6 illustrate ways of forming the connection between the gate electrodes and the p-type region 15 in the embodiment depicted in FIG. 4. Like the configuration shown in FIG. 3, in FIG. 5 the gate electrode material is extended above the trench 30 in the termination structure forming an extension 39. Connector 8 contacts this extension and connects with the p-type region 15 at the top major surface 22a of the semiconductor body. As in FIG. 3, in the case of the innermost lateral transistor, its gate electrode is electrically connected to the p-type region 15 by the source electrode 23.

In the embodiment of FIG. 6, the need to extend the gate electrodes 31 of the lateral devices beyond the respective trenches is avoided, by shifting laterally away from the active area 7 the insulating cap 34 above each gate electrode to expose a portion of the gate electrode for contact with connector 8 (or source electrode 23 in the case of the innermost lateral transistor).

Figure 7:
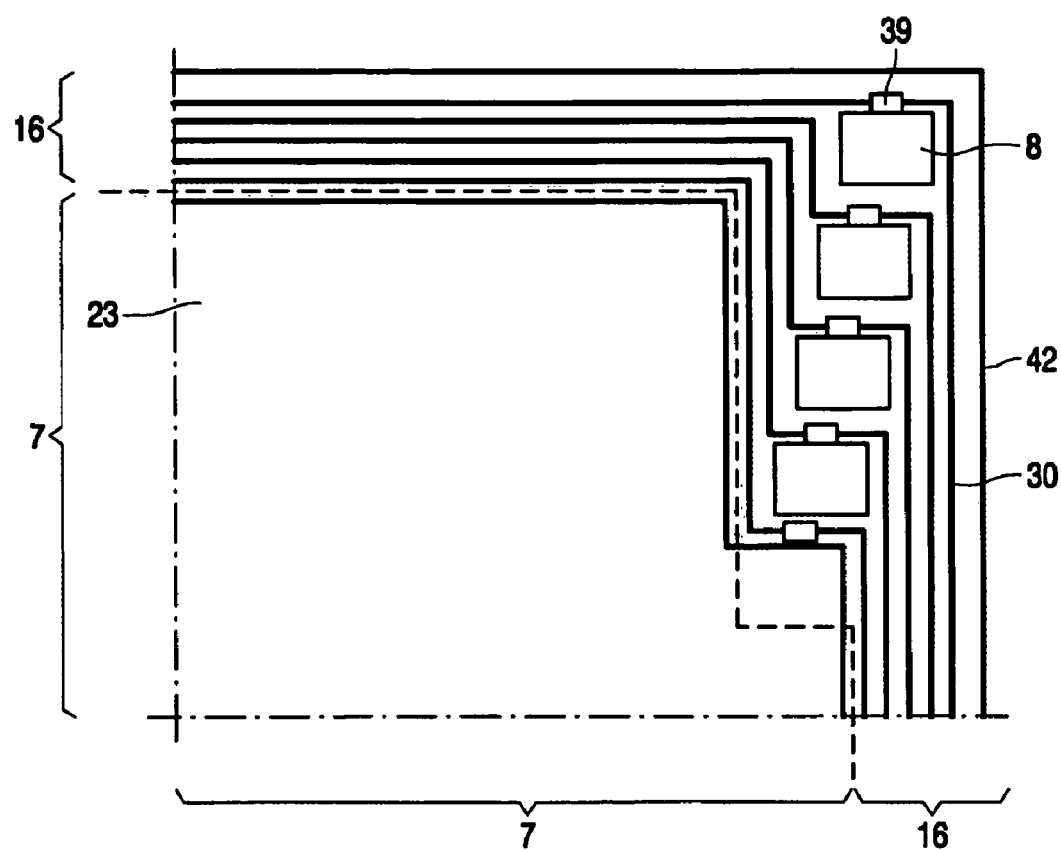
FIGS. 7 and 8 show plan views of a portion of the active area and termination structure of a semiconductor device in accordance with an embodiment of the invention.
Figure 8:
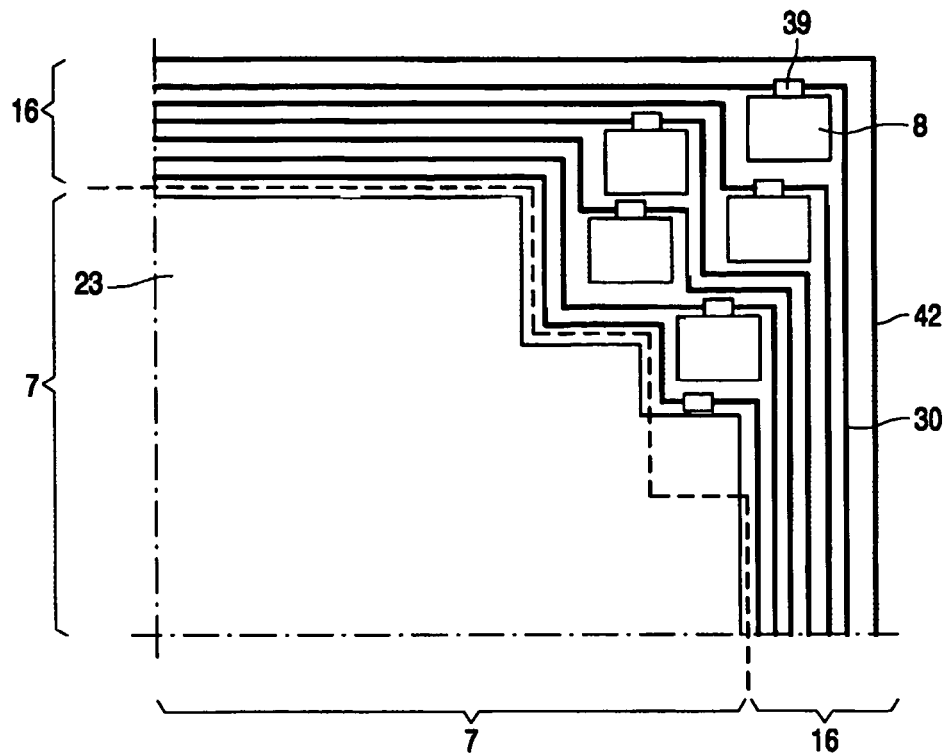

The area occupied by the termination structure may be minimised by having a close trench spacing in the majority of the structure and only increasing the spacing where necessary to allow for the connectors 8 described in relation to FIGS. 3, 5 and 6. For example, as shown schematically in FIGS. 7 and 8, the connectors may be located in one corner of the semiconductor body, adjacent to the peripheral edge 42 of the semiconductor body. Alternatively, the connectors may be distributed between two or more corners of the semiconductor body. Features overlying the extension 39 and the trenches 30 are not shown in FIGS. 7 and 8 for the purposes of illustration. In these examples, five and six trenches 30 of stripe geometry surround the active area 7 in the termination structure 16 in the configurations of FIGS. 7 and 8, respectively. The trenches 20 of the active area 7 may also have a stripe geometry, and it will be appreciated that other geometries may be used for the active area, such as square or close-packed hexagonal geometries, for example.

In an example of the device shown in FIG. 2 (referred to as "Example 1" below), the pitch of the lateral devices in the termination structure 16 is 2.4 microns, and the trench width is 0.5 microns. The gate insulating layer 25 is a 40 nm layer of silicon dioxide, the n-type region 14a has a doping level of $1 \times 10^{16}$ phosphorus or arsenic atoms per $cm^3$, the p-type region has a doping level of $1 \times 10^{17}$ boron atoms per $cm^3$, and the gate electrode is formed of n-type polycrystalline silicon with a doping level of $1 \times 10^{19}$ phosphorus atoms per $cm^3$. In this example, the transistor adjacent the peripheral edge 42 of the device will have a threshold voltage of around 2.3V. It will therefore start to conduct at this voltage (or slightly above it), and will transfer this voltage to the source of the adjacent lateral device. This will therefore have a back bias between its source and region 14a, increasing its threshold voltage slightly to around 2.7V, and so on along the string of lateral devices. With a string of 12 devices, the termination structure will have a breakdown voltage of around 35V or more. As the pitch of the lateral devices is 2.4 microns, only 28.8 microns will be required to accommodate the termination structure.

In order to accommodate the connectors 8 shown in FIGS. 3, 5 and 6, the pitch of the lateral devices may be increased locally to around 15 microns, for example.

Figure 9:
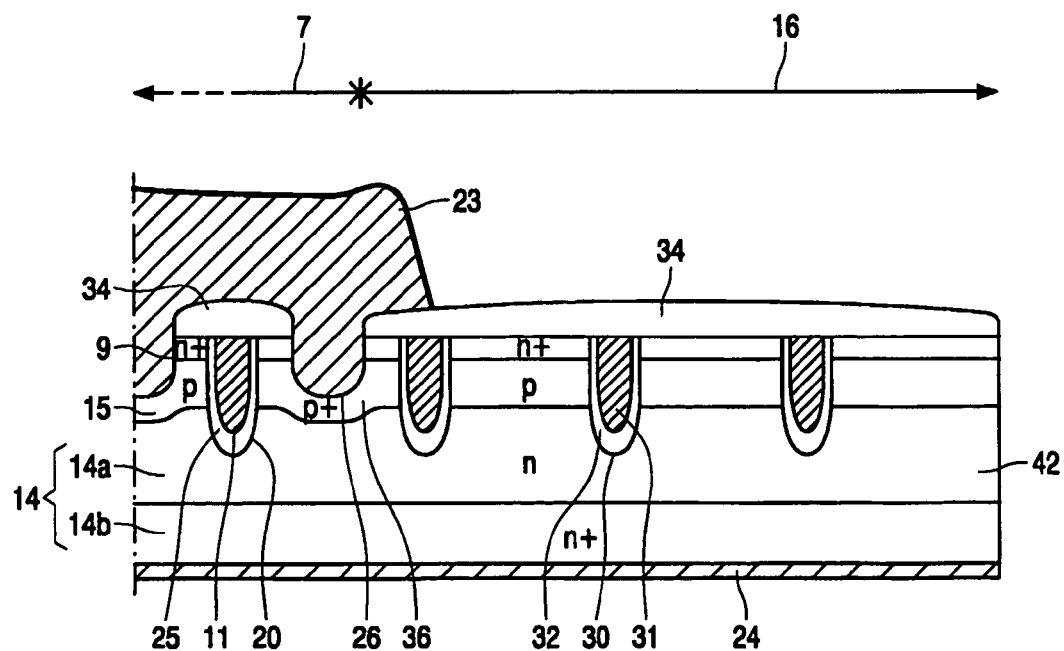
FIGS. 9 to 11 show cross-sectional views of the active area and termination structure of semiconductor devices in accordance with further embodiments of the invention.

The gate threshold voltage of the lateral transistors of the termination structure may be increased by increasing the thickness of the insulating layer 32 at the bottom of the gate electrode trenches 30, relative to at least a portion of the sidewalls of the trenches. This is illustrated in the embodiment of FIG. 9. This increases the voltage which may be supported across each lateral transistor and may enable the number of lateral transistor trenches to be reduced thereby reducing the area occupied by the termination structure. The thicker insulating layer may of course be included at the bottom of the trenches 20 in the active area, which may serve to reduce the gate-drain capacitance of the active area transistors, reducing the level of switching power losses in those devices. Thus, a thick insulating layer may be included at the bottom of the trenches in both the active area and the termination structure in the same processing step. Various methods may be employed to produce a thicker insulating layer at the bottom of the trenches. Examples are disclosed in U.S. Pat. No. 4,992,390, the contents of which are hereby incorporated herein as reference material.

For example, increasing the thickness of the insulating layer to 100 nm at the trench bottom (with a thickness of 40 nm over the trench sidewalls, and the devices otherwise having the same parameters as Example 1 above), increases the threshold voltage of the outermost device to around 3V, and so on. In this case, a breakdown voltage of around 40V or more is achieved by a string of only 7 devices.

Figure 10:
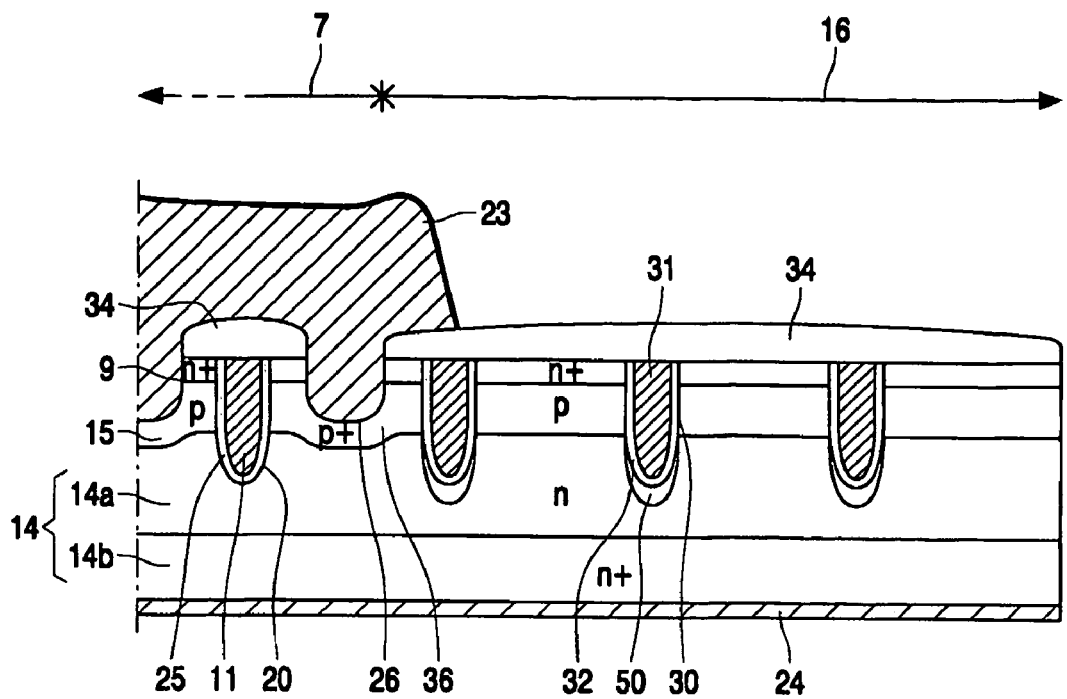

A further technique increase the gate threshold voltage of the lateral transistors of the termination structure is illustrated in FIG. 10. In this approach, a dopant of the first conductivity type (an n-type dopant such as phosphorus or arsenic in this example) is implanted into the bottom of the trenches to form implanted regions 50 adjacent the bottom of each of the gate trenches of the lateral devices. For example, a dose of $3 \times 10^{12}$ atoms per $cm^2$ in region 50 (the devices otherwise having the same parameters as Example 1 above), would increase the threshold voltage of the outermost device in the first example described above from 2.3V to around 5.6V, and so on. A string of 6 such devices would therefore exhibit a breakdown voltage of around 35V.

It may be advantageous for such a first conductivity type implanted region 50 to also be included adjacent the bottom of the gate trenches in the active area, in combination with a deeper channel-accommodating region, as described in EP-A-1041640, for example. The contents of EP-A-1041640 are incorporated herein as reference material. In this embodiment, the regions 50 may efficiently be formed in the active area and the termination structure in the same process step. The channel-accommodating region extends deeper than the trenches, but is overdoped by region 50 underneath the trenches. This combination results in the depth of the channel-accommodating region being self-aligned with that of the trench adjacent to the trench. Close control of this parameter enables reduction in the gate-drain capacitance in the active area, and therefore switching losses. Region 50 also acts in the active area to increase the conductivity locally, countering losses due to current crowding underneath the gate trench.

As shown in FIGS. 2 to 6, 9 and 10, a p-type region 36 may be included in the channel-accommodating region 15 between the source regions 9 adjacent the top major surface 22a, which is more highly doped than the channel-accommodating region 15. These regions may be formed by implantation through windows of an appropriate mask. These regions serve in a known manner to give a good contact between the channel-accommodating region 15 and the source electrode 23. They may also be included in the termination structure to enhance the contact between the region 15 and the connectors 8. The regions 36 may also extend more deeply than the channel-accommodating region 15 in the active area and/or the termination structure to reduce the electric field near the bottom of the adjacent trenches.

Figure 11:
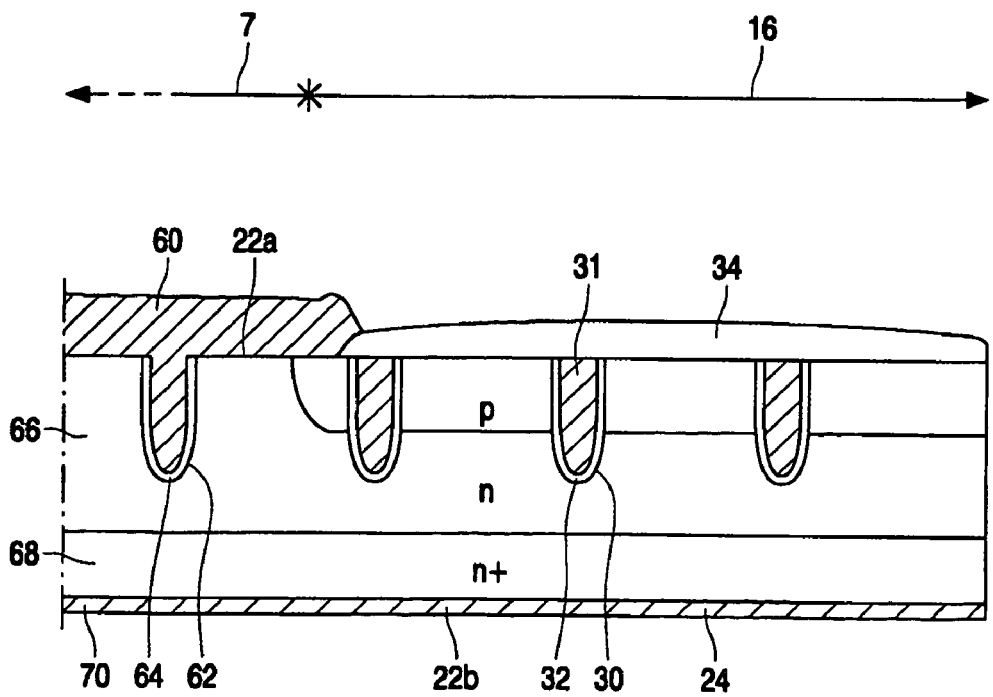

It will be appreciated that the termination structure of the invention may be advantageously employed in devices having trenched electrodes in the active area other than those illustrated in FIGS. 2 to 10. For example, it may be beneficial to use such a termination structure in a device having trenched Schottky rectifiers in the active area. An embodiment of this form is shown in FIG. 11. Such rectifiers are described in U.S. Pat. No. 4,646,115 (our ref. PHB33047) and U.S. Pat. No. 5,612,567, for example, the contents of which are incorporated herein as reference material.

As shown in FIG. 11, anode electrode 60 extends over the top major surface 22a of the semiconductor body and into trenches 62 in the active area 7. The anode electrode is separated from the walls and bottom of the trenches 62 by an insulating layer 64. It forms a Schottky barrier rectifying junction with a drift region 66 of the first conductivity type (n-type dopant in this example) at surface 22a. In this embodiment, more highly doped region 68 of the first conductivity type underlying the drift region 66 forms a cathode region, contacted at the bottom major surface 22b by cathode electrode 70.

It will be appreciated that where specific conductivity types are referred to in the examples above, it is within the scope of the invention for the conductivity types to be reversed, with references to n-type being replace by p-type and vice versa. In the examples depicted in the drawings the active devices are n-channel devices, in which the regions 9 and 14 are of n-type conductivity, the region 15 is of p-type, and an electron inversion channel 17 is induced in the region 15 by the gate electrode 11. By using opposite conductivity type dopants, these devices are instead p-channel devices. In this case, the regions 9 and 14 are of p-type conductivity, the region 15 is of n-type, and a hole inversion channel 17 is induced in the region 15 by the gate electrode 11. Furthermore, in this embodiment, the channel 35 induced in the termination structure will be an electron inversion channel in p-type region 14a.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present application or of any further application derived therefrom.

The invention claimed is:

1. A semiconductor device having a semiconductor body comprising an active area and a termination structure surrounding the active area, the termination structure comprising a plurality of lateral trenchgate transistor devices connected in series and extending from the active area towards a peripheral edge of the semiconductor body, each lateral device comprising a trench having a gate electrode therein separated from the semiconductor body by a layer of gate insulating material, the gate electrodes of the lateral devices extending through a region of a first conductivity type, and part way through an underlying region of a second, opposite conductivity type, the first conductivity type being one of n-type or p-type and the second conductivity type being the other of n-type or p-type, with each lateral device including an electrically conductive connection arranged between its gate electrode and the first conductivity type region at the side of the lateral device closer to the active area and configured to distribute a voltage difference between the active area and the peripheral edge across the lateral devices.

2. A semiconductor device of claim 1 wherein the active area comprises devices having a region of the first conductivity type which is formed in the same process step as the first conductivity type region of the lateral devices.

3. A semiconductor device of claim 1 wherein the insulated electrodes of the active area devices are gate electrodes of the trenchgate transistor devices, and the first conductivity type region of the active area devices forms a channel-accommodating region thereof.

4. A semiconductor device of claim 1 wherein the insulated electrodes of the active area devices are trenched electrodes of Schottky rectifiers.

5. A semiconductor device of claim 1 wherein the layer of insulating material is thicker over the bottom of the trenches of the lateral devices than over at least a portion of the sidewalls of said trenches.

6. A semiconductor device of claim 1 wherein the doping level of a respective portion of the region of second conductivity type adjacent the bottom of each of the gate trenches of the lateral devices is higher than that of the remainder of the second conductivity type region.

7. A semiconductor device of claim 1 wherein the semiconductor body is rectangular in the plane of the body, and the connections are provided towards one or more corners of the body.

8. A method of forming a semiconductor device having a semiconductor body comprising an active area and a termination structure surrounding the active area, the termination structure comprising a plurality of lateral trench-gate transistor devices connected in series and extending from the active area towards a peripheral edge of the semiconductor body, each lateral device comprising a trench having a gate electrode therein separated from the semiconductor body by a layer of gate insulating material, the gate electrodes of the lateral devices extending through a region of a first conductivity type, and part way through an underlying region of a second, opposite conductivity type, the first conductivity type being one of n-type or p-type and the second conductivity type being the other of n-type or p-type, with each lateral device including an electrically conductive connection arranged between its gate electrode and the first conductivity type region at the side of the lateral device closer to the active area and configured to distribute a voltage difference between the active area and the peripheral edge across the lateral devices, the method comprising forming the trenches, gate electrodes and layers of gate insulating material of the lateral devices in the same respective process steps as trenches, insulated electrodes therein and layers of material insulating the insulated electrodes of devices in the active area.

9. A method of claim 8 comprising forming a region of the first conductivity type in devices of the active area in the same process step as the first conductivity type region of the lateral devices.

10. A semiconductor device including a semiconductor body, the semiconductor device comprising:
an active area;
a termination structure surrounding the active area;
a plurality of lateral trenchgate transistor devices in the termination structure and configured and arranged in series extending from the active area towards a peripheral edge of the semiconductor body;
a trench in each of the lateral trenchgate transistor devices;
a gate electrode, associated with each of the trenches, extending through a region of a first conductivity type, and partially through an underlying region of a second opposite conductivity type and separated from the semiconductor body by a layer of gate insulating material; the first conductivity type being one of n-type or p-type and the second conductivity type being the other of n-type or p-type, and
an electrically conductive connection between the gate electrode of each lateral device and the first conductivity type region at the side of the lateral device closer to the active area, the electrically conductive connection being configured and arranged to distribute a voltage difference between the active area and the peripheral edge across the lateral devices.

11. A semiconductor device of claim 10 wherein the plurality of lateral trench gate transistor devices have a pitch of 2.4 microns.

12. A semiconductor device of claim 10 wherein the termination structure has a breakdown voltage greater than 35 Volts.

* * * * *